United States Patent [19]

Kinoshita

[11] Patent Number: 5,073,808
[45] Date of Patent: Dec. 17, 1991

[54] SOLID STATE SEMICONDUCTOR DEVICE

[75] Inventor: Takao Kinoshita, Tokyo, Japan

[73] Assignee: Canon Kabushiki Kaisha, Tokyo, Japan

[21] Appl. No.: 384,096

[22] Filed: Jul. 24, 1989

Related U.S. Application Data

[63] Continuation of Ser. No. 73,346, Jul. 13, 1987, abandoned, which is a continuation of Ser. No. 656,728, Oct. 1, 1984, abandoned.

[30] Foreign Application Priority Data

Oct. 7, 1983 [JP] Japan ................. 58-187862

[51] Int. Cl.[5] ................. H01L 27/14; H01L 31/00
[52] U.S. Cl. ................. 357/30; 357/32; 357/24
[58] Field of Search ............ 357/24 LR, 32, 30 D, 357/30 H, 30 J, 30 K, 30 L, 30 Q

[56] References Cited

U.S. PATENT DOCUMENTS

| 4,194,213 | 3/1980 | Kano et al. ............ 357/24 LR X |
| 4,291,322 | 9/1981 | Clemens et al. ......... 357/59 X |
| 4,329,706 | 5/1982 | Crowder et al. ......... 357/71 P X |
| 4,362,597 | 12/1982 | Fraser et al. .......... 357/71 P X |
| 4,366,335 | 12/1982 | Feng et al. ............ 357/30 X |
| 4,443,652 | 4/1984 | Izu et al. ............. 357/30 X |
| 4,567,524 | 1/1986 | Levine ................. 357/24 LR X |

FOREIGN PATENT DOCUMENTS 53-37392 4/1978 Japan.
WO8202284 7/1982 PCT Int'l Appl.
1408892 10/1975 United Kingdom.

OTHER PUBLICATIONS

Ross, D., "Optoelektonik", Oldenbourg, 1982, pp. 150-151.
Ross, D., "Optical Devices and Optical Imaging Techniques", The Macmillian Press, 1979, pp. 121-125.

Primary Examiner—Andrew J. James
Assistant Examiner—Sara W. Crane
Attorney, Agent, or Firm—Fitzpatrick, Cella, Harper & Scinto

[57] ABSTRACT

A solid-state semiconductor device which is used as an image sensor or the like has a transfer electrodes which are formed over a semiconductor substrate through an insulating layer and consist of material having a relatively low conductivity wiring means are arranged along the directions of the surfaces of the transfer electrodes and consist of material having a relatively high conductivity for short-circuiting parts of the transfer electrodes. In this device, the signal transfer charcteristics of the transfer electrodes are improved.

48 Claims, 4 Drawing Sheets

FIG. IA
(PRIOR ART)
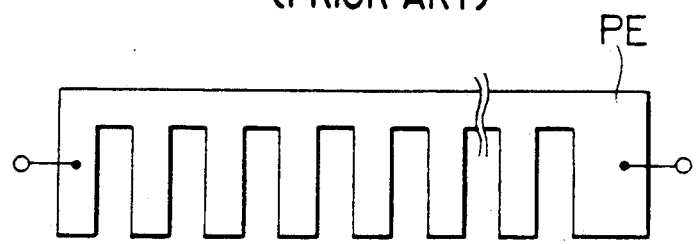
FIG. IB
(PRIOR ART)
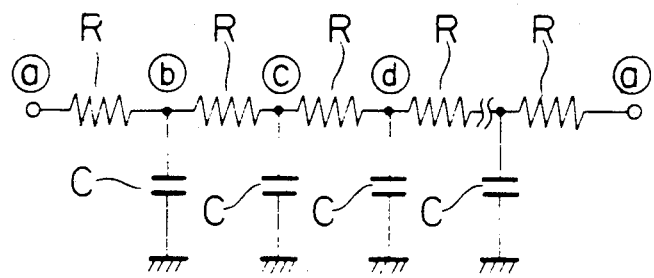
FIG. 2

SOLID STATE SEMICONDUCTOR DEVICE

This application is a continuation of application Ser. No. 073,346, filed July 13, 1987, now abandoned, which is a continuation of application Ser. No. 656,728, filed Oct. 1, 1984, now abandoned.

BACKGROUND OF THE INVENTION

1. Field of the Invention

The present invention relates to a solid-state semiconductor device having excellent high-speed transfer characteristics.

2. Description of the Prior Art

Conventionally, various line sensors and image sensors, as shown in FIG. 1A, using a charge transfer device, such as a CCD, BBD or the like, have been considered. In such sensors, high integration and high transfer speed are being advanced.

On the other hand, in sensors, where an improvement in the aperture ratio is desired, a structure, such that the area of the light shielding portion in the photosensitive surface is made to be as small as possible, is needed. In addition, in many cases, a transparent electrode such as polysilicon or the like is used as a transfer electrode in order to significantly increase the light incidence into the photoelectric converting section.

However, since such poly-silicon has a relatively low conductivity and it is also necessary to improve the aperture ratio as mentioned above, it is more thinly formed.

Therefore, a distributed parameter circuit as shown in FIG. 1B is equivalently formed by resistors which the transfer electrode itself has and capacitors between the semiconductor substrate and the electrode.

FIG. 1A is a diagram showing an example of a pattern of a transfer electrode PE. Also, R denotes resistors and C indicates capacitors. Thus, as shown in FIG. 2, the control waveform at an input terminal (a) is gradually smoothed as shown at (b) and (c) as it is transmitted, causing various problems.

Namely, since the control waveform is smoothed at the portion near the central portion of the transfer electrode pattern, the potential well under the electrode is made shallow, causing the transfer efficiency to deteriorate. When a high voltage is applied to the input terminal (a) for prevention of such deterioration of the transfer efficiency, the power loss becomes extremely large.

On the other hand, since the shapes of the potential wells which are respectively formed at the central and peripheral portions of the transfer electrode pattern differ, the shading phenomenon is significant. In particular, such a problem becomes larger as the frequency of the control signal, which is applied to the transfer electrode, becomes higher.

Generally, in the case of realizing a high resolution of the image sensor, the number of bits which are read out in a unit time has to be increased. However, such a drawback becomes a large obstacle for making the transfer speed high.

SUMMARY OF THE INVENTION

It is an object of the present invention to solve the drawbacks of the charge transfer device as mentioned above.

Another object of the invention is to provide the charge transfer device which can reduce a degree of smoothness of the transfer clock waveform.

Still another object of the invention is to provide a charge transfer device in which high integration and high-speed transfer are possible.

A further object of the invention is to provide a charge transfer device with less smear and less shading.

BRIEF DESCRIPTION OF THE DRAWINGS

FIGS. 1A and 1B are diagrams showing an example of a conventional charge transfer device, in which FIG. 1A shows an electrode pattern diagram and FIG. 1B shows an equivalent circuit diagram;

FIG. 2 is a signal waveform diagram at points (a), (b) and (d) in FIG. 1B;

FIGS. 3A to 3D are diagrams for explaining a first embodiment of the present invention, in which FIG. 3A shows an electrode diagram, FIG. 3B shows a cross sectional view taken along the line A-A', FIG. 3C shows a cross sectional view taken along the line B-B', and FIG. 3D shows a cross sectional view taken along the line C-C';

FIGS. 4A to 4D are diagrams showing a second embodiment, in which FIG. 4A shows an electrode diagram, FIG. 4B shows a cross sectional view taken along the line A-A', FIG. 4C shows a cross sectional view taken along the line B-B', and FIG. 4D shows a cross sectional view taken along the line C-C'; and FIGS. 5A and 5B are diagrams showing a third embodiment, in which FIG. 5A shows an electrode diagram and FIG. 5B shows a cross sectional view taken along the line E-E'.

DETAILED DESCRIPTION OF THE PREFERRED EMBODIMENTS

The present invention will now be described in detail hereinbelow with respect to several embodiments thereof.

Figure 3A:
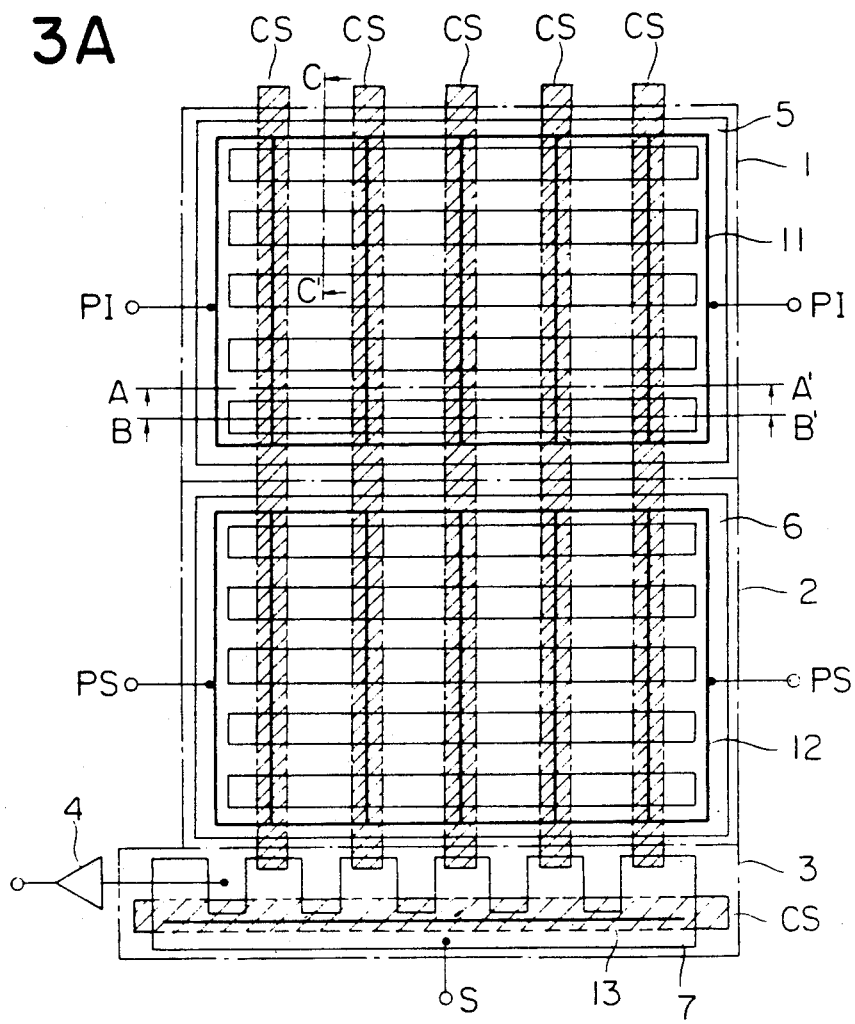
Figure 3B:
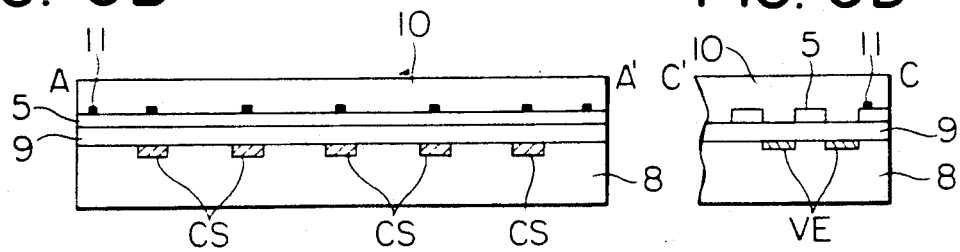
Figure 3D:
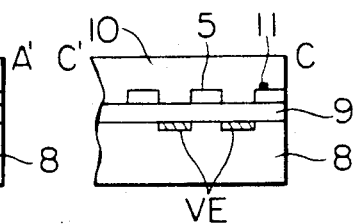
Figure 3C:
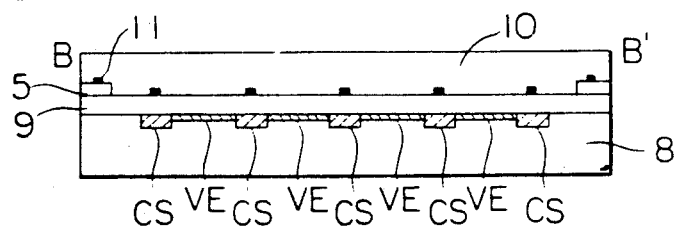

FIGS. 3A to 3D are diagrams showing a first embodiment of the present invention. This embodiment relates to the case where the invention was applied to an image sensor using a frame transfer type CCD. FIG. 3A is a diagram showing an electrode pattern, FIG. 3B is a cross sectional view taken along the line A-A' of FIG. 3A, FIG. 3C is a cross sectional view taken along the line B-B', and FIG. 3D is a cross sectional view taken along the line C-C'.

In the diagram, a reference numeral 1 denotes an image pickup part; 2 is a storage part; 3 a horizontal shift register; 4 an output amplifier; 5 a transfer electrode of the image pickup part 1; and 6 and 7 respectively transfer electrodes of the storage part 2 and horizontal shift register 3. The transfer electrodes 5 to 7 all consist of transparent material having a relatively low conductivity such as, e.g., poly-silicon and function as the control electrodes.

Each transfer electrode is disposed over a semiconductor substrate 8 through an insulating layer 9.

CS denotes channel stops serving as separating means. In the case where the semiconductor substrate 8 consists of, e.g., p-type silicon, these channel stops CS are formed by way of a method whereby p$^-$ semiconductor is diffused or the like. In addition, these channel stops serve to separate the respective elements in the semiconductor substrate. VE indicates virtual electrodes which are formed by ion-implanting boron, for instance.

On the other hand, in the region separated by the channel stops CS, a transfer electrode and virtual electrode pair constitute each element.

In addition, PI is a transfer clock signal to control the transfer and the like by the transfer electrode 5; PS is a transfer clock signal to control the transfer and the like by the transfer electrode 6; and S is a transfer clock signal to control the transfer and the like by the transfer electrode 7.

Numerals 11 to 13 denote aluminum wiring patterns consisting of material having a relatively higher conductivity than the transfer electrodes. These aluminum wiring patterns 11 to 13 are formed on the surfaces of the respective transfer electrodes 5 to 7 by way of evaporation deposition or the like and serve as wiring means according to the present invention. In this embodiment, the wiring patterns 11 to 13 are arranged over the channel stops CS and in the outer periphery out of the angle of field in the transfer electrodes and short-circuit at least parts of the transfer electrodes in order to supplement the signal transfer characteristics of the transfer electrodes.

In addition, in this embodiment, these aluminum wiring patterns are continuously connected.

On one hand, a numeral 10 denotes an insulating layer consisting of silicon oxide or the like for protection of the whole IC.

With such an arrangement, for example, when a low level signal is applied as the signal PI, the distributed charges corresponding to the image entered in the image pickup part 1 are stored in the potential wells under the virtual electrodes surrounded by the channel stops CS and transfer electrode 5, respectively.

Next, by supplying about six pulses regarding the signals PI and PS, the charges under the virtual electrodes of the image pickup part 1 are accumulated in the potential wells, for instance, under the virtual electrodes of the storage part 2. In addition, the charges in this storage part can be read out one line at a time by supplying the signals PS and S.

According to this embodiment, although the transfer clock signals PI and PS are respectively inputted from both ends of the electrodes 5 and 6, at this time, the poly-silicon electrodes are partially short-circuited in the directions of the surfaces thereof by the aluminum wiring pattern 11; therefore, the distributed resistance in the poly-silicon electrode pattern becomes substantially zero, so that the degree of smoothness of the transfer clock signal waveform can be minimized.

Moreover, in this embodiment, since the aluminum wiring pattern is arranged at the location where it does not affect the pixels in the image pickup part, namely, at the outer peripheral portion of the transfer electrodes and over the channel stops, the aperture ratio of the image pickup part is not affected any more.

In addition, in this embodiment, since the aluminum wiring pattern is continuously connected, it is difficult to cause the variation in resistance distribution in the transfer electrodes.

In this embodiment also, since the transfer electrode 6 of the storage part 2 is made of the same material as the transfer electrode 5 of the image pickup part, the IC manufacturing process is simplified.

Also, in this embodiment, since the material having high conductivity such as poly-silicon, i.e., having low etching speed is used as the transfer electrodes, fine etching can be performed and embodiment is suitable for realization of the high integration. Also, since the distributed resistances in the directions of the surfaces of the transfer electrodes are suppressed to be low by the wirings having relatively high conductivity, high speed transfer can be performed. On the contrary, due to this, since the thickness of poly-silicon of the transfer electrode can be made thin, the sensitivity for blue and therefore the sensitivity of the whole sensor can be increased.

Although an aluminum wiring pattern was used as the wiring means in this embodiment, it is also possible to use a metal having a relatively high conductivity and high melting point such as, e.g., silicide molybdenum, silicide tungsten, silicide tantalum, or silicide titanium.

On the other hand, as the transfer electrodes, a transparent material having a high conductivity such as tin oxide other than the poly-silicon may be used.

Figure 4A:
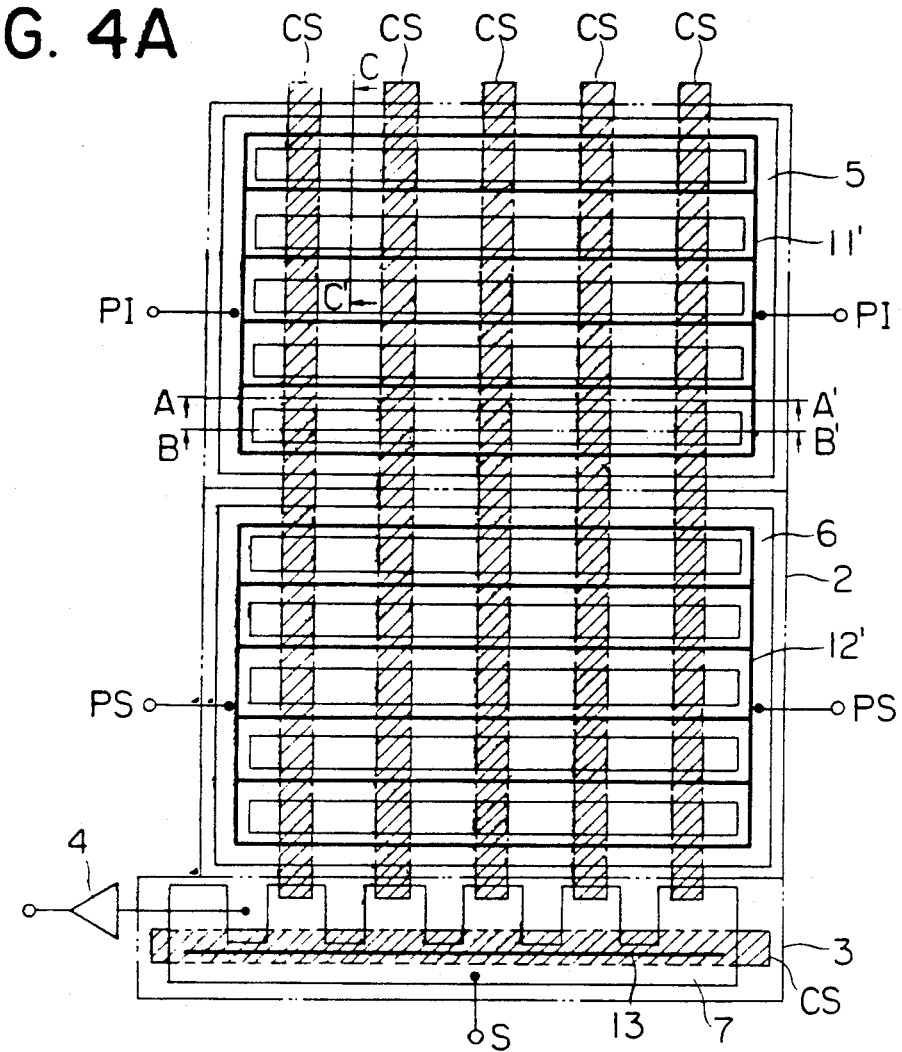
Figure 4B:
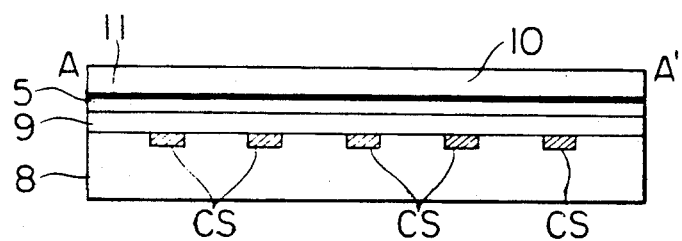
Figure 4D:
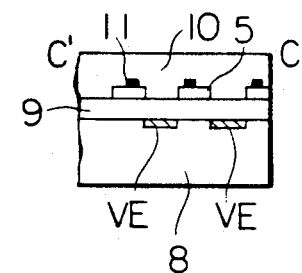
Figure 4C:
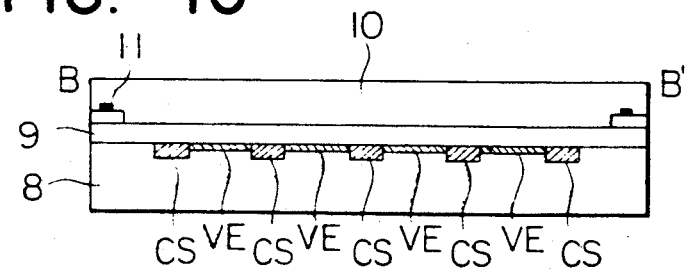

Next, FIGS. 4A to 4D are diagrams showing a second embodiment of the invention, in which FIG. 4A is an electrode pattern diagram, FIG. 4B is a cross sectional view taken along the line A-A' thereof, FIG. 4C is a cross sectional view taken along the line B-B', and FIG. 4D is a cross sectional view taken along the line C-C', in which the same parts and components as those shown in FIGS. 3A to 3D are designated by the same reference numerals. In this embodiment, aluminum wiring patterns 11' and 12' as the wiring means are formed at the outer peripheral portion out of the angle of field in the transfer electrodes 5 and 6 and on the surfaces in the horizontal directions of the transfer electrodes due to the evaporation deposition or the like.

With such an arrangement, since the aluminum wirings cover parts of the pixels, an effect which is nearly equal to that in the first embodiment can be obtained although the aperture ratio slightly decreases. In addition, it is obviously desirable that the horizontal aluminum wiring pattern in the angle of field of the image pickup part is made to be thin.

Figure 5A:
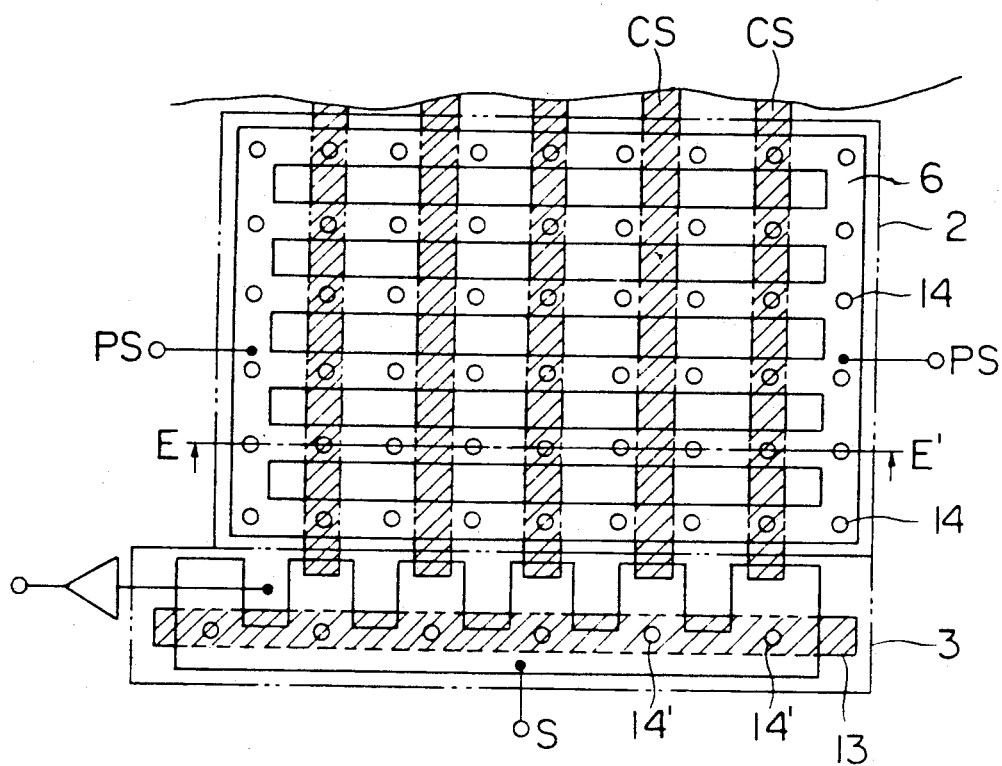
Figure 5B:
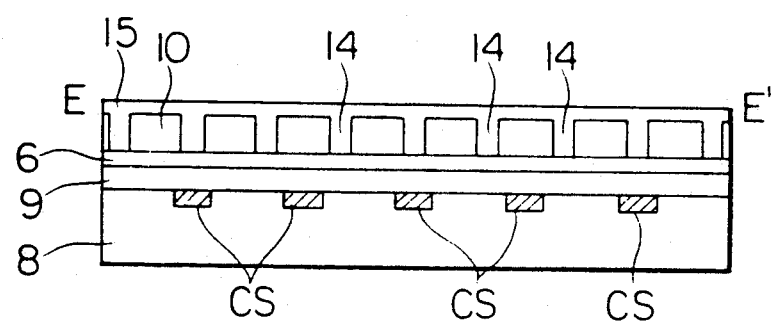

On the other hand, FIGS. 5A and 5B are diagrams showing a third embodiment of the invention, in which FIG. 5A is an electrode diagram and FIG. 5B is a cross sectional view taken along the line E-E' thereof. This embodiment shows another example of the wiring means of the storage part 2 and horizontal shift register 3.

In the diagram, the same parts and components as those shown in FIGS. 1 to 4 are designated by the same reference numerals. Further, a numeral 15 denotes a wiring layer consisting of aluminum or the like as the wiring means. This wiring layer also serves as the light shielding layer to shield the storage part 2 and horizontal shift register 3 from the light.

The wiring layer 15 of the storage part 2 and a wiring layer of the horizontal shift register 3 are insulated. Numerals 14 and 14' denote connecting portions to respectively connect the above-mentioned respective wiring layers 15 with the transfer electrodes 6 and 7 at a plurality of portions. When an insulating oxide film 10 is formed after the transfer electrode 6 of FIG. 5B was formed, only these connecting portions are masked for prevention of the formation of the oxide film. Then, when the wiring layer 15 is evaporation deposited, the wiring layer 15 and the transfer electrodes are electrically connected through these holes.

With such an arrangement, an effect such that the light shielding can be also performed by the wiring layer is derived.

In addition, the material of the transfer electrode 6 and the material of the wiring layer as the wiring means may be the same as those in the foregoing first and second embodiments.

This embodiment has a feature such that at least three or more connecting portions are provided so that the portions near both ends of the transfer electrode and the portion near the central portion can be short-circuited by the wiring layer.

As described above, according to the present invention, the charge transfer device has: the transfer electrodes which are arranged over the semiconductor substrate through the insulating layer and consist of material having a relatively low conductivity; and the wiring means which is arranged along the directions of the surfaces of the transfer electrodes and consist of material having a relatively high conductivity in order to short-circuit parts of the transfer electrodes. Therefore, the fine etching of the transfer electrodes can be performed and also high integration can be realized. At the same time, it is possible to eliminate the smoothing of the transfer waveform in this case, so that high speed transfer can be performed and smear can be prevented. Also, there are many effects such that the transfer efficiency is improved and the shading can be prevented, and the like.

What I claim is:

1. A solid state semiconductor device comprising:
   (a) a semiconductor substrate;
   (b) a plurality of photoelectric converting elements formed in said substrate;
   (c) an insulating layer disposed on said plurality of photoelectric converting elements
   (d) a control electrode having a plurality of portions disposed on said insulating layer and arranged in a first predetermined pattern, said control electrode controlling the transfer of carriers accumulated in said photo-electric converting elements and said control electrode being transparent so as to transmit a light incident thereon to said plurality of photo-electric converting elements; and
   (e) wiring means arranged in a second predetermined pattern for short-circuiting a plurality of parts of said control electrode, said wiring means being disposed directly on said control electrode arranged over said photo-electric converting elements and said insulating layer, wherein the width of said wiring means is narrower than that of said control electrode so that a sufficient amount of the light incident upon said control electrode can be transmitted to said photoelectric converting elements through said control electrode to cause said control electrode to function as a light receiving area.

2. A device according to claim 1, wherein a conductivity of said wiring means is higher than that of said control electrode.

3. A device according to claim 1, wherein each of said elements includes a potential well.

4. A device according to claim 3, wherein the photoelectric conversion is performed in the semiconductor substrate under said control electrodes.

5. A device according to claim 4, wherein said control electrodes are translucent.

6. A device according to claim 5, wherein said control electrodes include poly-silicon.

7. A device according to claim 3, wherein said wiring means are arranged at the locations apart from said potential wells.

8. A device according to claim 1, wherein said wiring means short-circuit at least near the edge portions and near the central portions of said control electrodes.

9. A solid state semiconductor device comprising:
   (a) a semiconductor substrate;
   (b) a plurality of photo-electric converting elements formed in said substrate;
   (c) a control electrode having a plurality of portions formed over said photo-electric converting elements so that said control electrode is arranged in a photo-electric converting portion and functions as a light receiving element which transmits light to said photo-electric converting elements, said control electrode controlling the transfer of carriers accumulated in said photo-electric converting elements in a first direction, wherein said control electrode is arranged in a second direction in said photo-electric converting portion, and wherein the first direction is arranged substantially perpendicular to the second direction; and
   (d) wiring means for short-circuiting a plurality of parts of said control electrode, and being arranged in the second direction along said control electrode and disposed directly on a portion of said control electrode arranged over said photo-electric converting elements, wherein the width of said wiring means is narrower than that of said control electrode.

10. A device according to claim 9, wherein a conductivity of said wiring means is higher than that of said control electrode.

11. A device according to claim 9, wherein said control electrodes are translucent.

12. A device according to claim 11, wherein said control electrodes include poly-silicon.

13. A solid state semiconductor device to claim 9, wherein said conductive member is provided over said control electrode.

14. A device according to claim 9, wherein said plurality of elements constitute a CCD.

15. A device according to claim 9, wherein said plurality of elements respectively include potential wells.

16. A device according to claim 15, wherein each of said potential wells stores the charges obtained by the photo-electric conversion.

17. A device according to claim 16, wherein the photo-electric conversion is performed in the semiconductor substrate under said control electrodes.

18. A solid state semiconductor device comprising:
   (a) a semiconductor substrate including an image sensing device formed therein, said image sensing device comprising at least an image portion and an accumulating portion;
   (b) an insulating layer disposed on said semiconductor substrate;
   (c) a control electrode having a plurality of portions disposed on said insulating layer and arranged in a first predetermined pattern, said control electrode controlling image sensing operation of said image sensing device, and said control electrode being transparent so as to transmit the incident light to said image sensing device; and
   (d) wiring means arranged in a second predetermined pattern for short-circuiting said plurality of parts of said control electrode, said wiring means being disposed directly on said control electrode and said insulating layer, wherein the width of said wiring means formed over said image pickup portion, is narrower than that of said control electrode so that a sufficient amount of the light incident upon said control electrode formed over said image pickup portion can be transmitted to said image pickup portion through said control electrode to cause said control electrode to function as a light receiving area, and wherein said wiring means directly disposed on said control electrode formed over said accumulating portion is disposed so as to screen said accumulating portion from the light.

19. A solid state semiconductor device according to claim 18, wherein the conductivity of said wiring means is higher than that of said control electrode.

20. A solid state semiconductor device according to claim 18, wherein each of said elements includes a potential well.

21. A solid state semiconductor device according to claim 20, wherein the photoelectric conversion is performed in the semiconductor substrate under said electrode.

22. A solid state semiconductor device according to claim 21, wherein said control electrodes are translucent.

23. A solid state semiconductor device according to claim 22, wherein said control electrode include polysilicon.

24. A solid state semiconductor device according to claim 20, wherein said wiring means are arranged at the locations apart from said potential wells.

25. A solid semiconductor device according to claim 18, wherein said control electrode has a central portion interposed between two edge portions and said wiring means short-circuits at least parts of said control electrode near the edge portions and near the central portion of said control electrode.

26. A solid state semiconductor device comprising:
(a) a semiconductor substrate;
(b) a plurality of photo-electric converting elements formed in said substrate;
(c) an insulating layer disposed on said plurality of photo-electric converting elements;
(d) a stripe-like, control electrode having a plurality of portions arranged in a first direction and disposed on said insulating layer for controlling said plurality of elements, said control electrode being transparent so as to transmit a light incident thereon to said plurality of photo-electric converting elements; and
(e) a stripe-like wiring means arranged in a second direction and disposed directly on a plurality of portions of said control electrode in said photo-electric conversion portion and on said insulating layer to short-circuit said control electrode, wherein the width of said wiring means is narrower than that of said control electrode so that a sufficient amount of the light incident upon said control electrode can be transmitted to said photo-electric converting elements through said control electrode to cause said control electrode to function as a light receiving area.

27. A solid state semiconductor device according to claim 26, wherein a conductivity of said wiring means is higher than that of said control electrode.

28. A solid state semiconductor device according to claim 26, wherein each of said elements include a potential well.

29. A solid state semiconductor device according to claim 28, wherein the photoelectric conversion is performed in the semiconductor substrate under said control electrodes.

30. A solid state semiconductor device according to claim 29, wherein said control electrodes are translucent.

31. A solid state semiconductor device according to claim 30, wherein said control electrodes include polysilicon.

32. A solid state semiconductor device according to claim 28, wherein wiring means are arranged at the locations apart from said potential wells.

33. A solid state semiconductor device according to claim 26, wherein said wiring means short-circuits at least parts near the edge portions and near the central portions of said control electrodes.

34. A solid state semiconductor device comprising:
(a) a semiconductor substrate;
(b) a plurality of photo-electric converting elements formed in said substrate;
(c) an insulating layer disposed on said plurality of photo-electric converting elements;
(d) a control electrode disposed on said insulating layer and arranged in a first predetermined pattern having connection portions which are connected directly to plurality of portions of said photo-electric converting elements, controlling transfer of change generated in said plurality of photo-electric converting elements, and being transparent so as to transmit a light incident thereon to said plurality of photo-electric converting elements; and
(e) wiring means arranged in a second predetermined pattern for compensating the signal transfer characteristics of said control electrode, said wiring means being provided directly on said control electrode over said elements and said insulating layer, and the wherein width of said wiring means is narrower than that of said control electrode so that a sufficient amount of the light incident upon said control electrode can be transmitted to said photo-electric converting elements through said control electrode to cause said control electrode to function as a light receiving area.

35. A device according to claim 34, wherein said wiring means is provided on said control electrodes by way of evaporation deposition or the like.

36. A device according to claim 34, wherein the conductivity of said wiring means is higher than that of said control electrode.

37. A device according to claim 34, wherein said each of said elements includes a potential well.

38. A device according to claim 37, wherein the photo-electric conversion is performed in the semiconductor substrate under said control electrodes.

39. A device according to claim 38, wherein said control electrodes are transparent.

40. A device according to claim 39, wherein said control electrode are made of a material including polysilicon.

41. A device according to claim 37, wherein said wiring means are arranged at a location apart from said potential wells.

42. A device according to claim 34, wherein said wiring means short-circuits parts of said electrodes near their edges with parts of said control electrode near the central portion thereof.

43. A solid state semiconductor device wherein a change transfer portion is arranged in a photo-electric converting portion, said solid state semiconductor device comprising:
(a) a semiconductor substrate;

(b) a plurality of photo-electric converting elements formed in said substrate;

(c) an insulating layer disposed on said plurality of photo-electric converting elements;

(d) a control electrode arranged in a first predetermined pattern and disposed on said insulating layer and disposed in the photo-electric converting portion, said control electrode having a plurality of portions formed over said semiconductor substrate, controlling said plurality of photo-electric elements and being transparent so as to transmit a light incident thereon to said plurality of photo-electric converting elements; and (e) wiring means arranged in a second predetermined pattern for compensating the signal transfer characteristics of said control electrode, said wiring means being directly connected to a portion on said control electrode in the photo-electric converting portion and being disposed on said insulating layer, wherein said wiring means has a width narrower than that of the said control electrode, so that a sufficient amount of the light incident upon said control electrode can be transmitted to said photo-electric converting elements through said control electrode to cause said control electrode to function as a light receiving area.

44. A device according to claim 1 wherein said first predetermined pattern is arranged orthogonally to said second predetermined pattern.

45. A device according to claim 18, wherein said first predetermined pattern is arranged orthogonally to said predetermined pattern.

46. A device according to claim 34 wherein said first predetermined pattern is arranged orthogonally to said second predetermined pattern.

47. A device according to claim 43 wherein said first predetermined pattern is arranged orthogonally to said second predetermined pattern.

48. A device according to claim 26, wherein said stripe-like control electrode is arranged orthogonally to said stripe-like wiring means.

* * * * *

UNITED STATES PATENT AND TRADEMARK OFFICE
CERTIFICATE OF CORRECTION

PATENT NO. : 5,073,808
DATED : December 17, 1991
INVENTOR(S) : TAKAO KINOSHITA

It is certified that error appears in the above-identified patent and that said Letters Patent is hereby corrected as shown below:

On the title page:

IN [56] REFERENCES CITED

Under OTHER PUBLICATIONS, ""Optoelektonik"," should read --"Optoelektronik,-- and "MacMillian" should read --MacMillan--.

IN [57] ABSTRACT

Line 2, "a transfer" should read --transfer--.
   Line 5, "conductivity wiring" should read --conductivity.  Wiring--.

COLUMN 1

Line 66, "the" (second occurrence) should read --a--.
   Line 67, "a" should read --the--.

COLUMN 2

Line 16, "cross" should read --cross- --.
   Line 19, "cross sectional" should read --cross-sectional--.
   Line 23, "cross sectional" should read --cross-sectional--.
   Line 24, "cross sectional" should read --cross-sectional--.
   Line 26, "cross sectional" should read --cross-sectional--.
   Line 29, "cross sectional" should read --cross-sectional--.
   Line 42, "cross sectional" should read --cross-sectional--.
   Line 43, "cross sectional" should read --cross-sectional--.
   Line 44, "cross sectional" should read --cross-sectional--.

UNITED STATES PATENT AND TRADEMARK OFFICE
CERTIFICATE OF CORRECTION

PATENT NO. : 5,073,808
DATED : December 17, 1991
INVENTOR(S) : TAKAO KINOSHITA

It is certified that error appears in the above-identified patent and that said Letters Patent is hereby corrected as shown below:

COLUMN 3

Line 64, "embodiment" should read --the embodiment--.
Line 65, "the high" should read --high--.

COLUMN 4

Line 16, "cross sec-" should read --cross-sec- --.
Line 18, "cross sectional" should read --cross-sectional--.
Line 19, "cross sectional" should read --cross-sectional--.
Line 37, "cross" should read --cross- --.
Line 54, "15" should be deleted.

COLUMN 5

Line 29, "elements" should read --elements;--.

COLUMN 6

Line 33, "device to" should read --device according to--.

COLUMN 7

Line 16, "said elec-" should read --said control elec- --.
Line 19, "electrodes are" should read --electrode is--.
Line 22, "include" should read --includes--.
Line 27, "solid" should read --solid state--.

UNITED STATES PATENT AND TRADEMARK OFFICE
CERTIFICATE OF CORRECTION

PATENT NO. : 5,073,808
DATED : December 17, 1991
INVENTOR(S) : TAKAO KINOSHITA

It is certified that error appears in the above-identified patent and that said Letters Patent is hereby corrected as shown below:

<u>COLUMN 8</u>

```
Line  8, "wiring means" should read --said wiring means--.
Line 25, "change" should read --charges--.
Line 34, "the wherein" should read --wherein the--.
Line 47, "said" should be deleted.
Line 51, "electrodes." should read --electrode.--.
Line 53, "electrodes are" should read --electrode is--.
Line 55, "are" should read --is--.
Line 61, "electrodes near" should read --electrodes
         at least near--.
Line 65, "change" should read --charge--.
```

Signed and Sealed this

Eighth Day of June, 1993

Attest:

MICHAEL K. KIRK

Attesting Officer

Acting Commissioner of Patents and Trademarks